United States Patent
Patel et al.

[19]

[11] Patent Number: 5,823,820
[45] Date of Patent: Oct. 20, 1998

[54] MICROPHONE CONNECTOR

[75] Inventors: Arvind Patel, Naperville; Nels Pearson, Deerfield; Robert Rushton, Villa Park, all of Ill.

[73] Assignee: Molex Incorporated, Lisle, Ill.

[21] Appl. No.: 804,621

[22] Filed: Feb. 27, 1997

[51] Int. Cl.[6] .................................................. H01R 3/00
[52] U.S. Cl. ...................... 439/500; 381/169; 439/856
[58] Field of Search ..................... 429/96–100; 439/55, 439/68, 856–857, 500, 660, 217–219; 381/168, 169

[56] References Cited

U.S. PATENT DOCUMENTS

| | | | |
|---|---|---|---|
| 3,856,577 | 12/1974 | Oki et al. ............................ | 136/171 |
| 4,718,742 | 1/1988 | Utoh et al. ........................... | 439/627 |
| 5,211,579 | 5/1993 | Seong et al. ........................ | 439/500 |
| 5,586,907 | 12/1996 | Frantz et al. ........................ | 439/500 |

*Primary Examiner*—Khiem Nguyen
*Attorney, Agent, or Firm*—Stephen Z. Weiss

[57] ABSTRACT

An electrical connector is provided for mounting a microphone which has opposite flat faces joined by an arcuate periphery, with a speaker in one of the flat faces. The connector includes a dielectric housing having a generally rectangular microphone insertion cavity for receiving the microphone inserted periphery-first into the cavity. The cavity is defined at least in part by opposing side walls of the housing adapted for engaging the opposite faces of the microphone at the edges thereof near the periphery of the microphone. At least one side wall has an opening in registry with the speaker face of the microphone. Terminals project into the cavity for engaging appropriate terminals on the microphone.

5 Claims, 3 Drawing Sheets

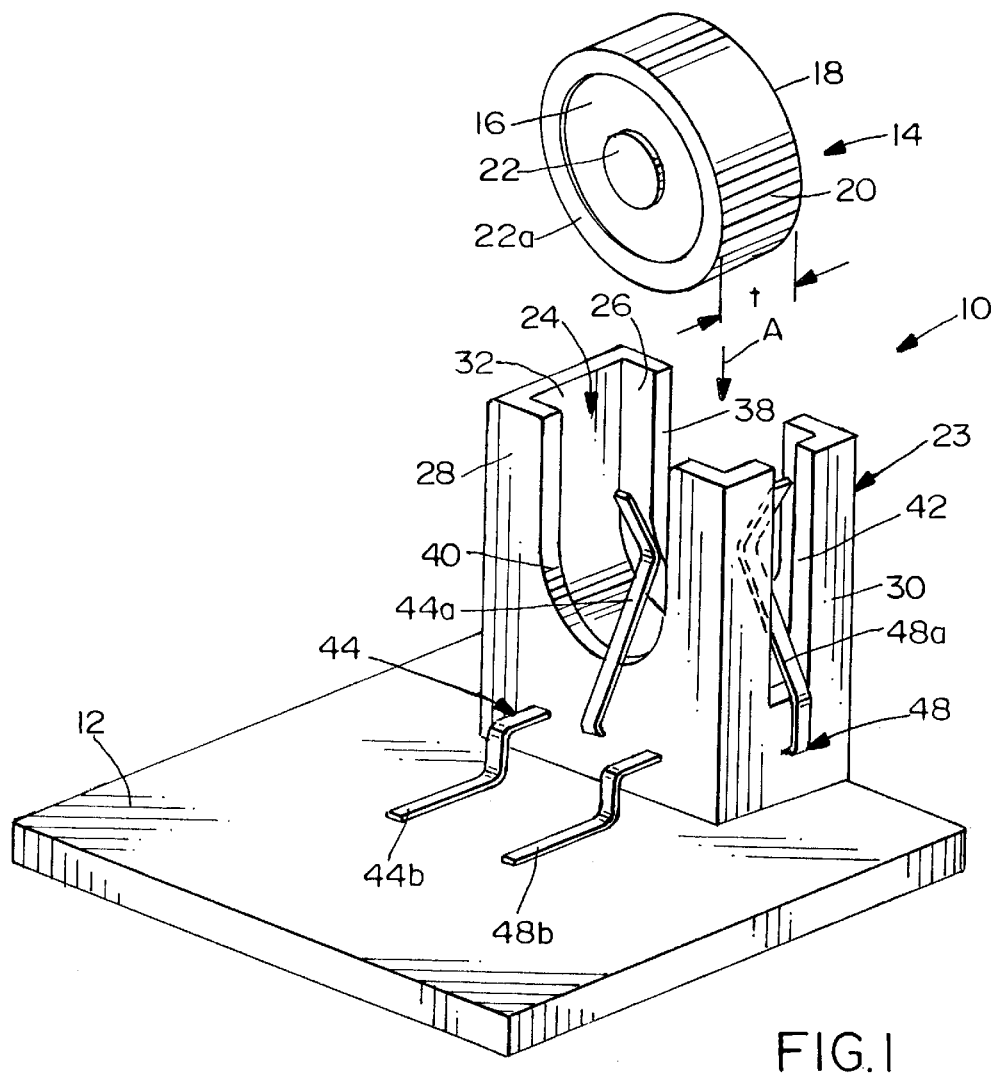
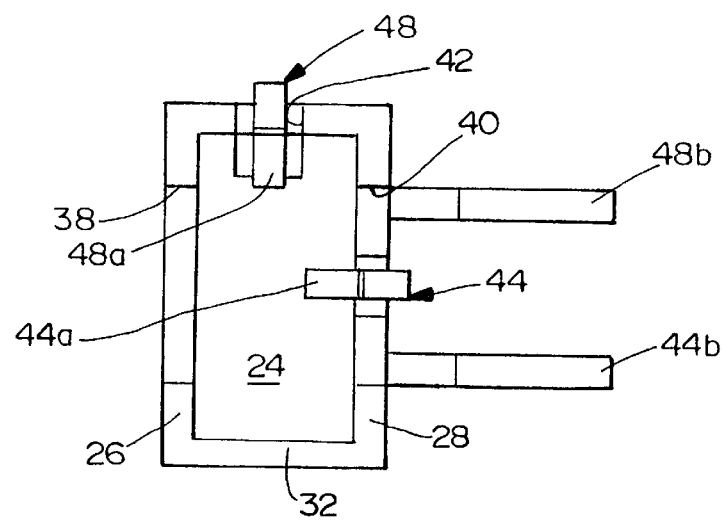
FIG.1
FIG.2

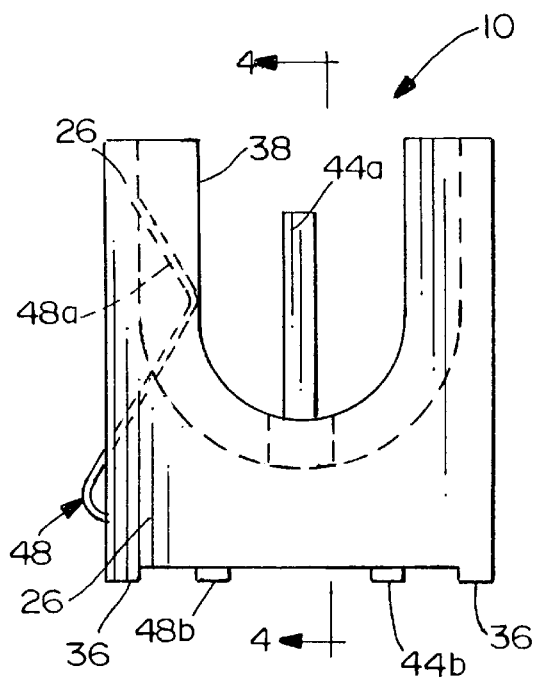
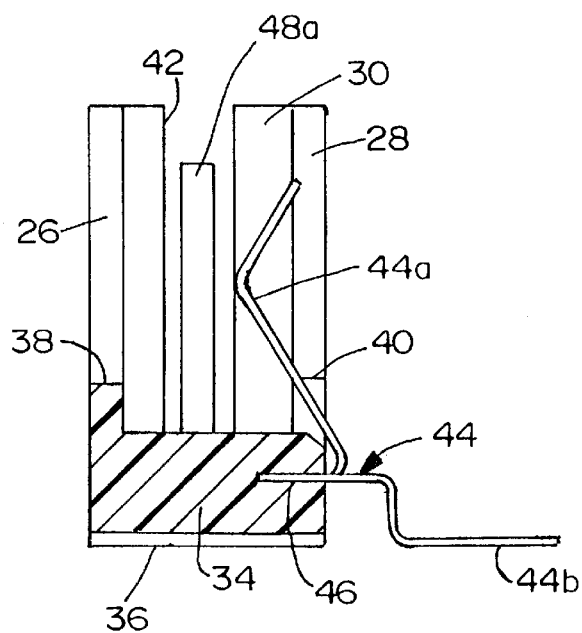
FIG.3  FIG.4
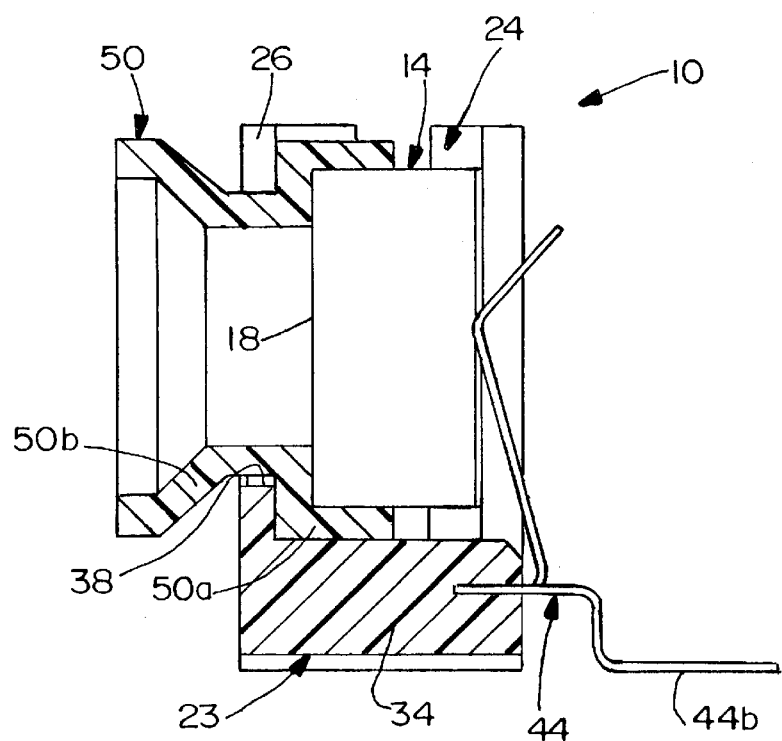
FIG.5

MICROPHONE CONNECTOR

FIELD OF THE INVENTION

This invention generally relates to the art of electrical connectors and, particularly, to an electrical connector for mounting a microphone.

BACKGROUND OF THE INVENTION

A variety of communication devices presently are being used extensively in a wide range of applications. Communication devices typically include a microphone enabling a user to send or receive audible messages. Generally, the microphone is a small device which, in essence, is a transmit electroacoustic transducer that converts acoustic signals into electrical signals. Consequently, electrical connectors are used to mount the microphone electrically connected to terminals of the connector. One use of such devices is in telephone handset systems, particularly for use in portable or mobile telephone systems.

One type of microphone for use in applications as described above is a disc type microphone which has opposite flat faces joined by a cylindrical or hemicylindrical periphery. One flat face of the microphone forms the speaker, and one or more terminals are disposed on the opposite flat face. The cylindrical periphery of the microphone typically is formed by a metal shell. The present invention is directed to an electrical connector for such microphones.

SUMMARY OF THE INVENTION

An object, therefore, of the invention is to provide a new and improved electrical connector for mounting a microphone which has opposite flat faces joined by an arcuate periphery, with a speaker in one of the flat faces.

In the exemplary embodiment of the invention, the connector includes a dielectric housing having a generally rectangular microphone insertion cavity for receiving the microphone inserted periphery-first into the cavity. The cavity is defined at least in part by opposing side walls adapted for engaging the opposite faces of the microphone at the edges thereof near the periphery thereof. At least one side wall has an opening in registry with the speaker in the one flat face of the microphone. Terminal means project into the cavity for engaging appropriate terminals on the microphone.

As disclosed herein, the opposite side wall has a second opening, and the terminal means include a first terminal projecting through the second opening. The housing includes a third side wall of the cavity generally perpendicular to the opposing side walls, and the third side wall has a third opening. The terminal means include a second terminal projecting through the third opening.

In an alternate embodiment of the invention, the microphone includes a miniature megaphone projecting from the speaker side of the microphone and through the opening in the one side wall of the housing. The miniature megaphone has a mounting lip about the microphone, and the opposing side walls of the housing are spaced sufficiently to accommodate the microphone and at least the mounting lip of the miniature megaphone.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1 is a perspective view of the electrical connector of the invention mounted on a circuit board, with the microphone about to be inserted into the connector;

FIG. 2 is a top plan view of the connector;

FIG. 3 is a rear elevational view of the connector;

FIG. 4 is a vertical section taken generally along line 4—4 of FIG. 3;

FIG. 5 is a vertical section through a second embodiment of the connector adapted for accommodating a microphone having a miniature megaphone projecting therefrom.

DETAILED DESCRIPTION OF THE PREFERRED EMBODIMENTS

Figure 6:
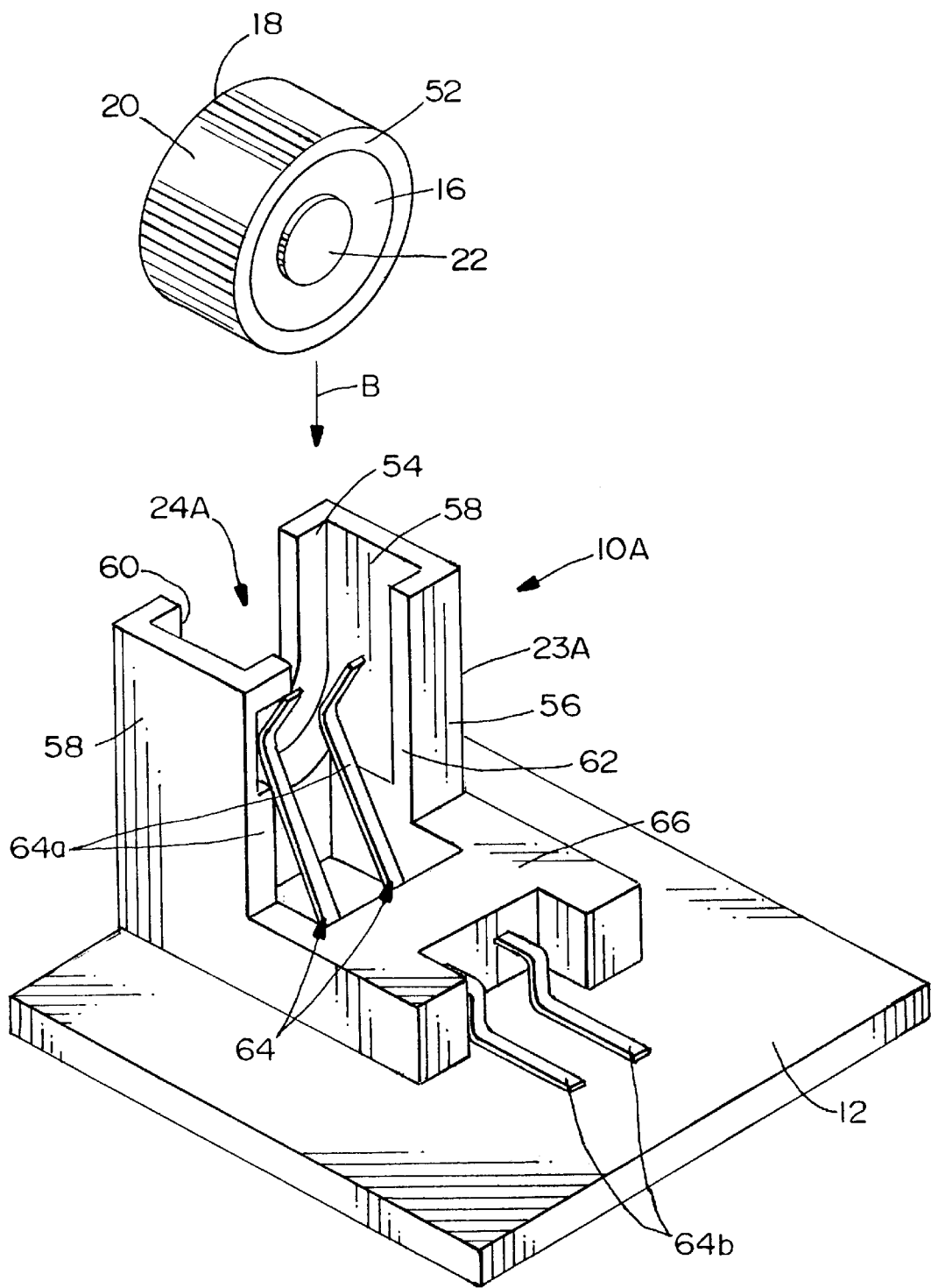
FIG. 6 is a perspective view of a third embodiment of the connector, mounted to a circuit board.

Referring to the drawings in greater detail, and first to FIG. 1, the invention is embodied in an electrical connector, generally designated 10, adapted for mounting on a circuit board 12. The connector is designed for receiving a microphone, generally designated 14, inserted periphery-first into the connector in the direction of arrow "A".

Microphone 14 is of a conventional construction and is of the disc type which includes opposite flat faces 16 and 18 joined by an arcuate periphery 20. Microphone 14 is circular so that periphery 20 is cylindrical. A center positive terminal 22 is located in the center of face 16, and opposite face 18 is the speaker face of the microphone. Periphery 20 actually is formed by a cylindrical metal shell which forms the negative terminal of the microphone. The metal shell has a ring-shaped lip 20a overlying the edge of each flat face 16 and 18 of the microphone.

Connector 10 includes a dielectric housing, generally designated 23, which has a generally rectangular microphone insertion cavity, generally designated 24, for receiving microphone 14 inserted periphery-first into the cavity in the direction of arrow "A". Referring to FIG. 2 in conjunction with FIG. 1, rectangular cavity 24 is defined by opposing major side walls 26 and 28 and opposing minor side walls 30 and 32. As seen in FIG. 4, the housing has a bottom wall 34 adapted for surface mounting on circuit board 12. As seen in FIGS. 3 and 4, a plurality of ribs 36 defined standoffs to elevate the housing slightly above the top surface of circuit board 12. Housing 23 is a one-piece structure unitarily molded of plastic material or the like.

Major side wall 26 of housing 23 has a first opening 38 which is in registry with the speaker in flat face 18 of the microphone when the microphone is fully inserted into the connector. Major side wall 28 has a second opening 40 through which one of the terminals project, as will be described hereinafter. Minor side wall 30 has a third opening 42 through which a second terminal projects as will be described hereinafter.

Generally, connector 10 includes terminal means projecting into cavity 24 of housing 23 for engaging center positive terminal 22 and peripheral negative terminal 20 of microphone 14. Specifically, the terminal means includes a first terminal, generally designated 44, which includes a flexible contact arm 44a and a solder tail 44b. The terminal is stamped and formed of sheet metal material and is mounted in bottom wall 34 of the housing, as at 46 (FIG. 4). Flexible contact arm 44*a* projects through second opening 40 in major side wall 28 into cavity 24 for engaging center positive terminal 22 of the microphone. Solder tail 44*b* is formed for connection, as by soldering, to an appropriate circuit trace on circuit board 12 as seen in FIG. 1.

The terminal means of connector 10 also includes a second terminal, generally designated 48, which includes a flexible contact arm 48*a* and a solder tail 48*b*. Again, terminal 48 is stamped and formed of sheet metal material and is mounted in bottom wall 34 of the connector housing. Flexible contact arm 48*a* projects through third opening 42 in minor side wall 30 for engaging the peripheral negative terminal provided by shell 20 of the microphone.

FIG. 5 shows a second embodiment of the invention wherein microphone 14 includes a miniature megaphone, generally designated 50. The connector in FIG. 5 is substantially identical to connector 10 in FIGS. 1–4 and, consequently, like reference numerals have been applied in FIG. 5 to designate like components described above and shown in FIGS. 1–4. The only substantial difference in the connector is the size of microphone insertion cavity 24.

More particularly, miniature megaphone 50 (FIG. 5) includes a mounting lip 50*a* which embraces speaker face 18 of microphone 14 to mount the miniature megaphone onto the microphone. The megaphone includes a funnel portion 50*b* which projects outwardly through opening 38 in major side wall 26 of housing 23. Therefore, the size of cavity 24 must be large enough to accommodate both microphone 14 and miniature megaphone 50. In other words, the distance between major side walls 26 and 28 and the distance between minor side walls 30 and 32 must be increased to accommodate the thickness of mounting lip 50*a* of the miniature megaphone which embraces speaker face 18 of the microphone.

FIG. 6 shows a third embodiment of the invention wherein a connector, generally designated 10A, is adapted for receiving a microphone 14 or microphone 14A. Microphone 14A again includes opposite flat faces 16 and 18, with face 18 being the speaker face of the microphone. Face 16 has a center positive terminal located in the center of face 16 and a ring shaped negative terminal 52 at the peripheral of the face 16.

Connector 10A in FIG. 6 again is adapted for mounting on circuit board 12. The connector includes a housing, generally designated 23A, having a generally rectangular microphone insertion cavity, generally designated 24A, for receiving microphone 14A inserted periphery-first into the cavity in the direction of arrow "B".

Housing 23A of connector 10A includes major side walls 54 and 56 and minor side walls 58 which define generally rectangular cavity 24. Minor side walls 58 are identical and solid, whereas major side wall 54 has a first opening 60 and major side wall 56 has a second opening 62. Opening 60 in major side wall 54 is in registry with speaker face 18 of microphone 14A when the microphone is inserted into the housing cavity.

A pair of substantially identical terminals, generally designated 64, are mounted through a base portion 66 of housing 23A. The terminals have flexible contact arms 64A which project through opening 62 in major side wall 56 for engaging positive and negative terminals 22, 52 on face 16 of microphone 14A. The terminals have solder tails 64B for connection, as by soldering, to appropriate circuit traces on circuit board 12.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electrical connector for mounting a microphone which has opposite flat faces joined by an arcuate periphery, with a speaker in one of the flat faces comprising:

a dielectric housing having a generally rectangular microphone insertion cavity for receiving the microphone inserted periphery-first into the cavity, the cavity being defined at least in part by opposing side walls adapted for engaging the opposite faces of the microphone at the edges thereof near said periphery, and at least one side wall having an opening in registry with the speaker face of the microphone;

said microphone further including a miniature megaphone projecting from the speaker face of the microphone and through the opening in said one side wall, the miniature megaphone having a mounting lip about the microphone, and said opposing side walls are spaced sufficiently to accommodate the microphone and at least the mounting lip of the miniature megaphone, and terminal means projecting into the cavity for engaging appropriate terminals on the microphone.

2. The electrical connector of claim 1 wherein the side wall opposite said one side wall has a second opening, and said terminal means include a first terminal projecting through the second opening.

3. The electrical connector of claim 2 wherein said housing includes a third side wall of the cavity generally perpendicular to said opposing side walls, the third side wall having a third opening, and said terminal means include a second terminal projecting through the third opening.

4. The electrical connector of claim 1 wherein the side wall opposite said one side wall has a second opening, and said terminal means include a pair of terminals projecting through the second opening.

5. An electrical connector for mounting a microphone which has opposite flat faces joined by a cylindrical periphery, with a speaker at one of the flat faces, a first microphone terminal at the other flat face and a second microphone terminal at the cylindrical periphery comprising:

a dielectric housing having a generally rectangular microphone insertion cavity for receiving the microphone inserted periphery-first into the cavity, the rectangular cavity being defined at least in part by a pair of opposing major side walls and a pair of opposing minor side walls, one of the major side walls having a first opening in registry with the speaker face of the microphone, the other major side wall having a second opening, and one of the minor side walls having a third opening;

said microphone further including a miniature megaphone projecting from the one flat face of the microphone through the first opening in the one major side wall of the housing, the miniature megaphone having a mounting lip about the microphone, and said opposing side walls of the housing are spaced sufficiently to accommodate the microphone and at least the mounting lip of the miniature megaphone;

a first terminal projecting into the cavity through the second opening in the other major side wall for engaging the first: microphone terminal at the one flat face of the microphone; and a second terminal projecting into the cavity through the third opening in the one minor side wall of the housing for engaging the second microphone terminal at the periphery of the microphone.

\* \* \* \* \*